US011283243B2

(12) United States Patent
Noda et al.

(10) Patent No.: US 11,283,243 B2
(45) Date of Patent: Mar. 22, 2022

(54) SURFACE-EMITTING LASER AND METHOD FOR MANUFACTURING SURFACE-EMITTING LASER (71) Applicants: KYOTO UNIVERSITY, Kyoto (JP); STANLEY ELECTRIC CO., LTD., Tokyo (JP)

(72) Inventors: Susumu Noda, Kyoto (JP); Yoshinori Tanaka, Kyoto (JP); Menaka De Zoysa, Kyoto (JP); Junichi Sonoda, Tokyo (JP); Tomoaki Koizumi, Tokyo (JP); Kei Emoto, Tokyo (JP)

(73) Assignees: KYOTO UNIVERSITY, Kyoto (JP); STANLEY ELECTRIC CO., LTD., Tokyo (JP)

( * ) Notice: Subject to any disclaimer, the term of this patent is extended or adjusted under 35 U.S.C. 154(b) by 141 days.

(21) Appl. No.: 16/488,595

(22) PCT Filed: Feb. 27, 2018

(86) PCT No.: PCT/JP2018/007272
§ 371 (c)(1),
(2) Date: Aug. 25, 2019

(87) PCT Pub. No.: WO2018/155710
PCT Pub. Date: Aug. 30, 2018

(65) Prior Publication Data
US 2020/0251887 A1    Aug. 6, 2020

(30) Foreign Application Priority Data

Feb. 27, 2017  (JP) .............................. JP2017-035504

(51) Int. Cl.
*H01S 5/02216* (2021.01)
*H01S 5/22* (2006.01)
(Continued)

(52) U.S. Cl.
CPC ...... *H01S 5/2216* (2013.01); *H01L 21/02433* (2013.01); *H01S 5/11* (2021.01);
(Continued)

(58) Field of Classification Search
CPC .... H01S 5/2216; H01S 5/2095; H01S 5/2202; H01S 5/11; H01S 5/12; H01S 5/18; H01S 5/3211; H01S 2304/04; H01L 21/02433
See application file for complete search history.

(56) References Cited

U.S. PATENT DOCUMENTS 8,129,210 B2  3/2012  Kawashima et al.
8,605,769 B2  12/2013  Yoshimoto et al.
(Continued)

FOREIGN PATENT DOCUMENTS

JP    2004111766 A    4/2004
JP    2009130110 A    6/2009
(Continued)

OTHER PUBLICATIONS

Machine translation of JP2010-161329 (Year: 2010).*
(Continued)

*Primary Examiner* — Yuanda Zhang
(74) *Attorney, Agent, or Firm* — Holtz, Holtz & Volek PC (57) ABSTRACT A method for manufacturing a surface emitting laser made of a group-III nitride semiconductor by an MOVPE method includes: (a) growing a first cladding layer of a first conductive type on a substrate; (b) growing a first optical guide layer of the first conductive type on the first cladding layer; (c) forming holes having a two-dimensional periodicity in a plane parallel to the first optical guide layer, in the first optical guide layer by etching; (d) supplying a gas containing a group-III material and a nitrogen source and performing growth to form recessed portions having a facet of a predetermined plane direction above openings of the holes,
(Continued)

thereby closing the openings of the holes; and (e) planarizing the recessed portions by mass transport, after the openings of the holes have been closed, wherein after the planarizing at least one side surface of the holes is a {10-10} facet.

11 Claims, 10 Drawing Sheets

(51) Int. Cl.
| | |
|---|---|
| H01S 5/18 | (2021.01) |
| H01S 5/32 | (2006.01) |
| H01L 21/02 | (2006.01) |
| H01S 5/11 | (2021.01) |
| H01S 5/12 | (2021.01) |
| H01S 5/20 | (2006.01) |

(52) U.S. Cl.
CPC ............... *H01S 5/12* (2013.01); *H01S 5/18* (2013.01); *H01S 5/2095* (2013.01); *H01S 5/2202* (2013.01); *H01S 5/3211* (2013.01); *H01S 2304/04* (2013.01)

(56) References Cited

U.S. PATENT DOCUMENTS

| | | | |
|---|---|---|---|
| 2008/0191223 A1* | 8/2008 | Nakamura | B82Y 20/00 257/95 |
| 2011/0134941 A1 | 6/2011 | Hoshino et al. | |
| 2011/0237077 A1 | 9/2011 | Kawashima et al. | |
| 2012/0027038 A1 | 2/2012 | Noda et al. | |
| 2013/0163628 A1 | 6/2013 | Hoshino et al. | |
| 2014/0327015 A1 | 11/2014 | Kawashima et al. | |

FOREIGN PATENT DOCUMENTS

| | | | | |
|---|---|---|---|---|
| JP | 2010161329 A | * | 7/2010 | ......... H01S 5/32341 |
| JP | 2011035078 A | | 2/2011 | |
| JP | 4818464 B2 | | 11/2011 | |
| JP | 2012015228 A | | 1/2012 | |
| JP | 2012033705 A | | 2/2012 | |
| JP | 5082447 B2 | | 11/2012 | |
| JP | 2013093367 A | | 5/2013 | |

OTHER PUBLICATIONS

International Search Report (ISR) dated May 15, 2018 (and English translation thereof) issued in International Application No. PCT/JP2018/007272.

Written Opinion of the International Search Authority dated May 15, 2018 issued in International Application No. PCT/JP2018/007272.

Miyake, et al., "Effects of Reactor Pressure on Epitaxial Lateral Overgrowth of GaN via Low-Pressure Metalorganic Vapor Phase Epitaxy", Japan Journal of Applied Physics, vol. 38 (1999) pp. L1000-L1002.

Nagamoto, et al., "GaN-based distributed-feedback surface-emitting laser with embedded two-dimensional photonic crystal fabricated by mass-transport technique", Semiconductor Laser Conference (ISLC), 2010, 09, 21st Annual Meeting of the IEEE.

Yoshimoto, et al., "GaN Photonic-Crystal Surface-Emitting Laser Operating at Blue-Violet Wavelengths", Laser and Electro-Optics Societ (LEOS) 2008,11, 22nd IEEE International.

Chinese Office Action (and English language translation thereof) dated Nov. 20, 2020 issued in Chinese Application No. 201880013880.2.

Extended European Search Report (EESR) dated Nov. 27, 2020 issued in European Application No. 18757376.1.

U.S. Appl. No. 16/956,512; First Named Inventor: Susumu Noda; Title: "Surface Emitting Laser Element and Manufacturing Method of the Same"; filed: Jun. 19, 2020.

Japanese Office Action dated Sep. 28, 2021 (and English translation thereof) issued in Japanese Application No. 2019-501872.

* cited by examiner

SURFACE-EMITTING LASER AND METHOD FOR MANUFACTURING SURFACE-EMITTING LASER

TECHNICAL FIELD

The present invention relates to a surface emitting laser and a method for manufacturing the surface emitting laser.

BACKGROUND ART

In recent years, surface emitting lasers using photonic crystals have been developed. For example, Patent Literature 1 discloses a semiconductor laser device intended for manufacturing without requiring fusion bonding.

Patent Literature 2 discloses a manufacturing method for producing a minute structure of a photonic crystal in a GaN-based semiconductor. Non-Patent Literature 1 discloses the manufacture of a photonic crystal by increasing a lateral growth rate by low pressure growth technique.

CITATION LIST

Patent Literature

Patent Literature 1: Japanese Patent No. 5082447
Patent Literature 2: Japanese Patent No. 4818464

Non-Patent Literature

Non-Patent Literature 1: H. Miyake et al.: Jpn. J. Appl. Phys. Vol. 38(1999) pp. L1000-L1002

SUMMARY OF INVENTION

Technical Problem

In a surface emitting laser having a photonic crystal, in order to obtain a high resonance effect, it is required to increase a diffraction effect in a photonic crystal layer. Namely, in order to increase the diffraction effect, it is required to have a uniform two-dimensional refractive index period in the photonic crystal, to have a high occupation ratio (filling factor) of a different refractive index area to a base material in the photonic crystal, to have a high ratio (light confinement coefficient) of light intensity (light field) distributed in the photonic crystal and the like.

Considering the aforementioned items, the present invention aims at providing a surface emitting laser including a photonic crystal that has a uniform refractive index period and a high diffraction effect, and a manufacturing method thereof. The present invention also aims at providing a surface emitting laser including a photonic crystal that has a high filling factor and a high light confinement coefficient, and a manufacturing method thereof.

Solution to Problem

The method for manufacturing a surface emitting laser made of a group-III nitride semiconductor by the MOVPE method according to the present invention comprises:

(a) a step of growing a first cladding layer of a first conductive type on a substrate;
(b) a step of growing a first optical guide layer of said first conductive type on said first cladding layer;
(c) a step of forming holes having a two-dimensional periodicity in a plane parallel to said first optical guide layer, in said first optical guide layer by etching;
(d) a step of supplying a gas containing a group-III material and a nitrogen source and performing growth to form recessed portions having a facet of a predetermined plane direction top of openings of said holes, thereby closing the openings of said holes; and
(e) a step of planarizing said recessed portions by mass transport, after said openings of said holes have been closed, wherein
after said planarizing step has been performed, at least one of side surfaces of said hole is a {10-10} facet.

The surface emitting laser made of a group-III nitride semiconductor according to the present invention comprises:

a first cladding layer of a first conductive type formed on a substrate;
a first optical guide layer of said first conductive type formed on said first cladding layer, the first optical guide layer having holes that are formed therein and arranged to have a two-dimensional periodicity in a plane parallel to said first optical guide layer;
a light emitting layer formed on said first optical guide layer;
a second optical guide layer of a second conductive type formed on said light emitting layer, the second conductive type being an opposite conductive type to said first conductive type; and
a second cladding layer of said second conductive type formed on said second optical guide layer, wherein
at least one of side surfaces of said hole is a {10-10} facet.

DESCRIPTION OF EMBODIMENTS

Preferred embodiments of the present invention will be described below, and the embodiments may be appropriately modified or combined. In the following description and accompanying drawings, substantially the same or equivalent portions are denoted by the same reference signs, and a description will be given based on the reference signs.

[Resonance Effect of Photonic Crystal Surface Emitting Laser]

To obtain a resonance effect in a surface emitting laser having a photonic crystal portion (hereinafter sometimes simply referred to as a photonic crystal surface emitting laser), it is desired to have a high diffraction effect in the photonic crystal portion.

More specifically, to increase the diffraction effect in the photonic crystal surface emitting laser, it is desired that (1) when $\lambda$ represents an oscillation wavelength and $n_{eff}$ represents the effective refractive index of the photonic crystal portion, the two-dimensional refractive index period P in the photonic crystal portion satisfies $P=m\lambda/n_{eff}$ (m is a natural number) in the case of a square-lattice two-dimensional photonic crystal, and satisfies $P=m\lambda \times 2/(3^{1/2} \times n_{eff})$ (m is a natural number) in the case of a triangular-lattice two-dimensional photonic crystal.

(2) the occupation ratio (FF: filling factor) of a different refractive index area to a base material in the photonic crystal portion is sufficiently high.

(3) the ratio $\Gamma_{PC}$: optical confinement factor) of optical power distribution in the photonic crystal portion of optical power distribution in the photonic crystal surface emitting laser is sufficiently high.

To satisfy the aforementioned (1), a lattice constant is required to be set appropriately in accordance with the oscillation wavelength of the photonic crystal laser. For example, in the case of oscillating at a wavelength of 405 nm using a gallium nitride-based material, $n_{eff}$ is of the order of 2.5, and so in the case of using a square-lattice two-dimensional photonic crystal, a lattice constant may be of the order of 162 nm.

Figure 1:
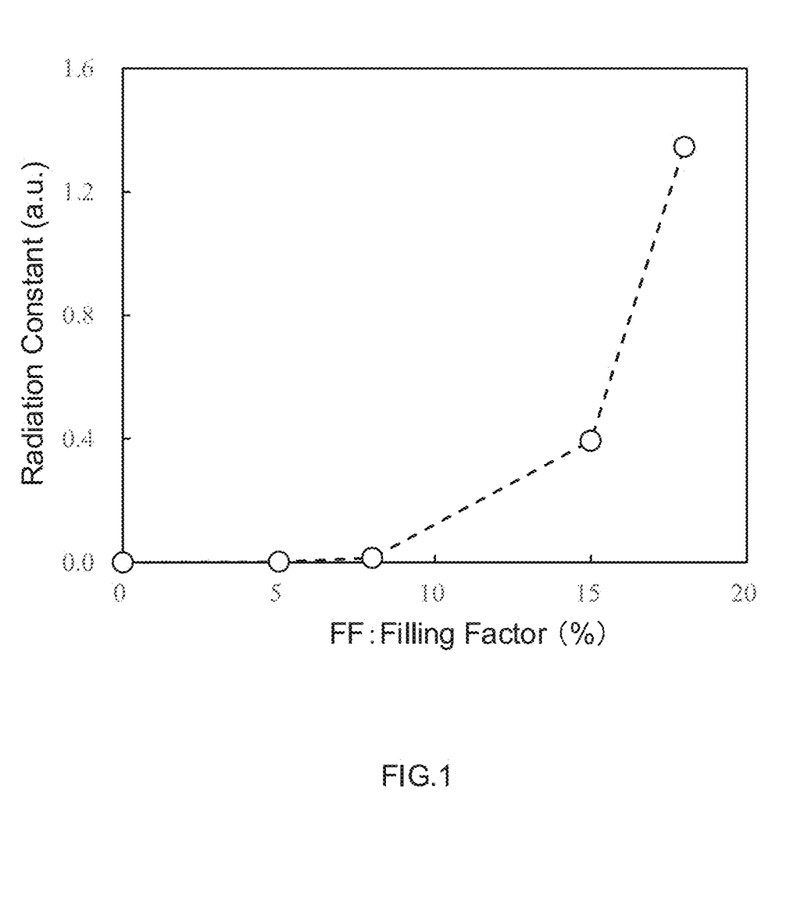
FIG. 1 is a graph of the relationship between a filling factor (FF) and a radiation factor of a photonic crystal portion in an emission direction.

As to the aforementioned (2), FIG. 1 shows the relationship between a filling factor (FF) and a radiation constant of a photonic crystal portion in an emission direction, in a square-lattice two-dimensional photonic crystal having, for example, a period of 161 nm and a distance between an active layer and the photonic crystal portion of 80 nm.

The radiation constant of the photonic crystal portion is the ratio of light radiating in the perpendicular direction (emission direction) to a photonic crystal surface by diffraction, while waves are guided through a unit length, out of light existing in the photonic crystal as a waveguide mode. In the photonic crystal portion, a loss is desired to be lower for better laser oscillation, but when the FF is less than 5%, the radiation factor becomes approximately 0 and it becomes difficult to extract light to the outside. In other words, to allow the function of a photonic crystal surface emitting laser, the filling factor (FF) is preferably 5% or more.

To satisfy the aforementioned (3), the distance between the photonic crystal portion and the active layer, and more specifically the distance between a top surface of the photonic crystal portion on the side of the active layer and a bottom surface of the first barrier layer of an MQW active layer on the side of the photonic crystal portion is required to be short. An increase in the thickness of the photonic crystal portion can increase $\Gamma_{PC}$, but the optical power distribution in the typical laser is generally sharp with respect to the vicinity of the active layer, to increase the optical confinement factor $\Gamma_{MQW}$ of the active layer. Therefore, there is a limit to improvement of $\Gamma_{PC}$ (the optical confinement factor of the photonic crystal portion), even if the thickness of the photonic crystal portion is increased. An increase in the thickness of the photonic crystal portion decreases the refractive index of a optical guide layer, so that $\Gamma_{MQW}$ becomes small and not preferable. Therefore, to obtain sufficient $\Gamma_{PC}$, it is desired to make the aforementioned distance short to bring the photonic crystal portion and the active layer close to each other.

Considering these matters, conventional techniques have the following problems. For example, in the technology of Patent Literature 1 described above, a thermal treatment is performed in a gas atmosphere containing a nitrogen source, without being supplied with group-III atoms, and thereafter another thermal treatment is performed at a higher temperature than the preceding step to fill narrow holes. However, when the holes are embedded in this manner, the holes are narrowed in the first heating step, and a sufficient FF cannot be obtained. Even if the first heating step is eliminated, the holes are narrowed during an increase in temperature and cannot be embedded in a sufficient FF state.

For example, in the technology of Patent Literature 2 described above, group-III atoms and a nitrogen source are supplied to a depressurized atmosphere, and the growth of a group-III nitride in a lateral direction is promoted to close narrow holes. This method enables embedding the narrow holes, while relatively maintaining the diameter of the holes. However, with reference to Non-Patent Literature 1, even if the lateral growth rate is increased by decompression, the lateral growth rate can be increased up to the order of 0.7 times faster than a vertical growth rate. In other words, even if the diameter of the embedded holes is maintained, the distance between the photonic crystal portion and the active layer becomes long, and therefore a sufficiently high $\Gamma_{PC}$ cannot be obtained.

A method in which a material having a low refractive index material such as $SiO_2$ or MgF is laid on the bottoms of the holes and the holes are embedded using these materials as a mask is also described. However, in this case, a shape processed by dry etching or the like remains as is, as the shape of the embedded holes. When holes are formed by dry etching or the like, it is difficult to etch the holes perfectly perpendicularly with respect to an in-plane direction of the optical guide layer, thus causing variations in the diameter of each hole in a depth direction. In other words, it is difficult to obtain a single periodical structure.

First Embodiment

Figure 2:
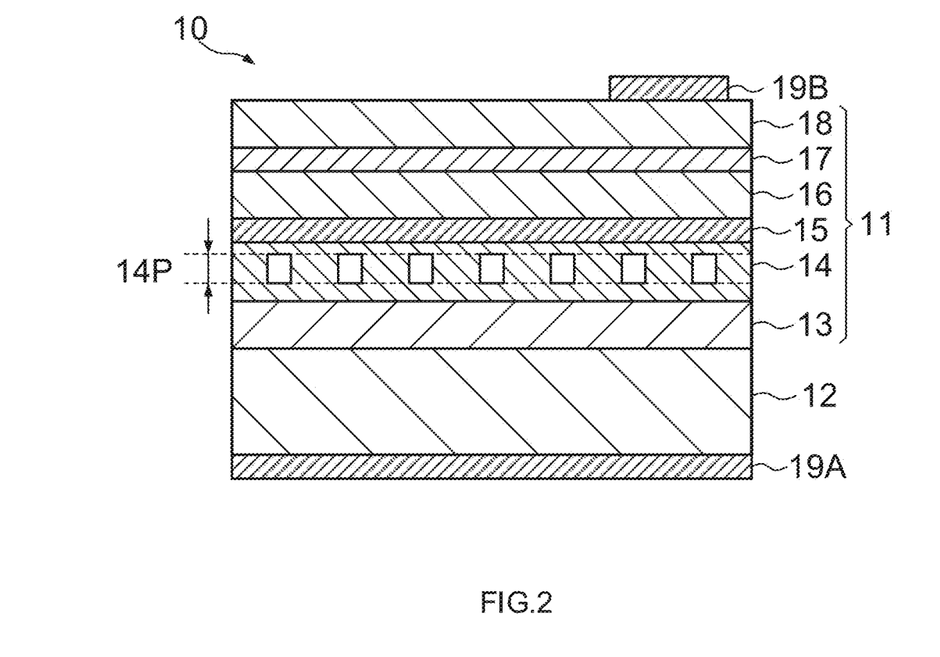
FIG. 2 is a cross-sectional view schematically illustrating a structure of a photonic crystal surface emitting laser according to a first embodiment.

FIG. 2 is a schematic cross-sectional view of a structure of a surface emitting laser (hereinafter sometimes simply referred to as photonic crystal surface emitting laser) 10 including a photonic crystal layer according to a first embodiment. As shown in FIG. 2, a semiconductor structure layer 11 is formed on a substrate 12. More specifically, an n-cladding layer 13, an n-optical guide layer 14, an active layer 15, a optical guide layer 16, an electron blocking layer 17, and a p-cladding layer 18 are sequentially formed in this order on the substrate 12. In other words, the semiconductor structure layer 11 is constituted of the semiconductor layers 13, 14, 15, 16, 17, and 18. The n-optical guide layer 14 contains a photonic crystal layer 14P.

An n-electrode 19A is formed on the n-cladding layer 12 (bottom surface), and a p-electrode 19B is formed on the p-cladding layer 18 (top surface).

Light from the surface emitting laser 10 is extracted in a direction perpendicular to the active layer 15 from a top surface of the semiconductor structure layer 11 (i.e., a front surface of the p-cladding layer 18) to the outside.

[Growth of Cladding Layers and Optical Guide Layers]

A manufacturing process of the semiconductor structure layer 11 will be described below in detail. The MOVPE (metalorganic vapor phase epitaxy) method was used as a crystal growth method, so that the semiconductor structure layer 11 was grown on the growth substrate 12 by normal-pressure (atmospheric pressure) growth.

As the growth substrate of the semiconductor structure layer 11, the n-type GaN substrate 12 whose growth face was a +c-plane was used. On the substrate 12, n-type AlGaN (a layer thickness of 2 μm) having an Al (aluminum) composition of 4% was grown as the n-cladding layer 13. Trimethylgallium (TMG) and trimethylaluminum (TMA) were used as a group-III MO (organic metal) material, and ammonia ($NH_3$) was used as a group-V material. Disilane ($Si_2H_6$) was supplied as a doping material. A carrier concentration at room temperature was approximately $5\times10^{18}$ $cm^{-3}$.

Subsequently, n-type GaN (a layer thickness of 300 nm) was grown as the n-optical guide layer 14 by the supply of TMG and $NH_3$. Disilane ($Si_2H_6$) was supplied and doped, while being grown. The carrier concentration was approximately $5\times10^{18}$ $cm^{-3}$.

[Formation of Holes in Optical Guide Layer]

Figure 3:
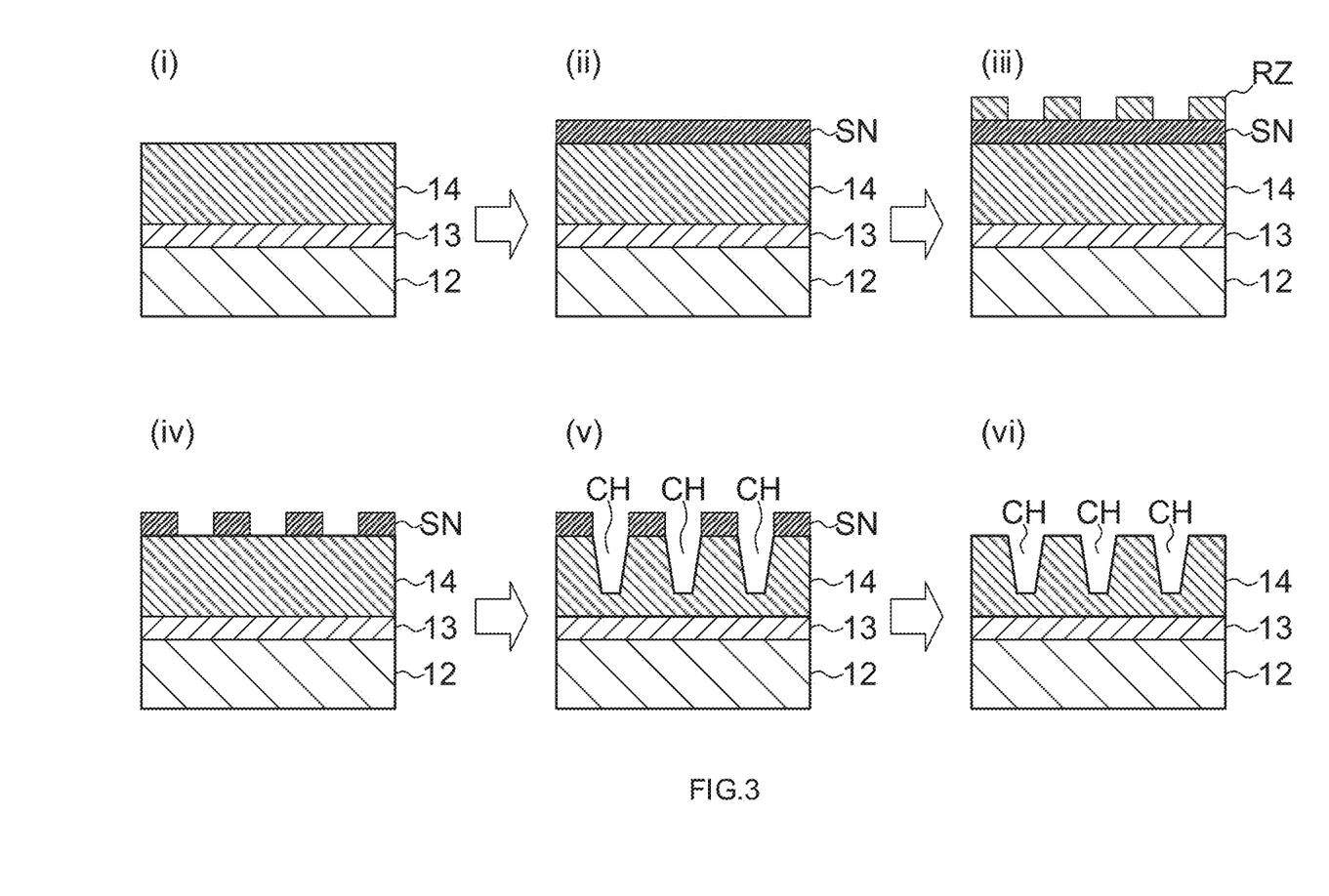
FIG. 3 is a cross-sectional view schematically illustrating a hole CH forming process.
Figure 4:
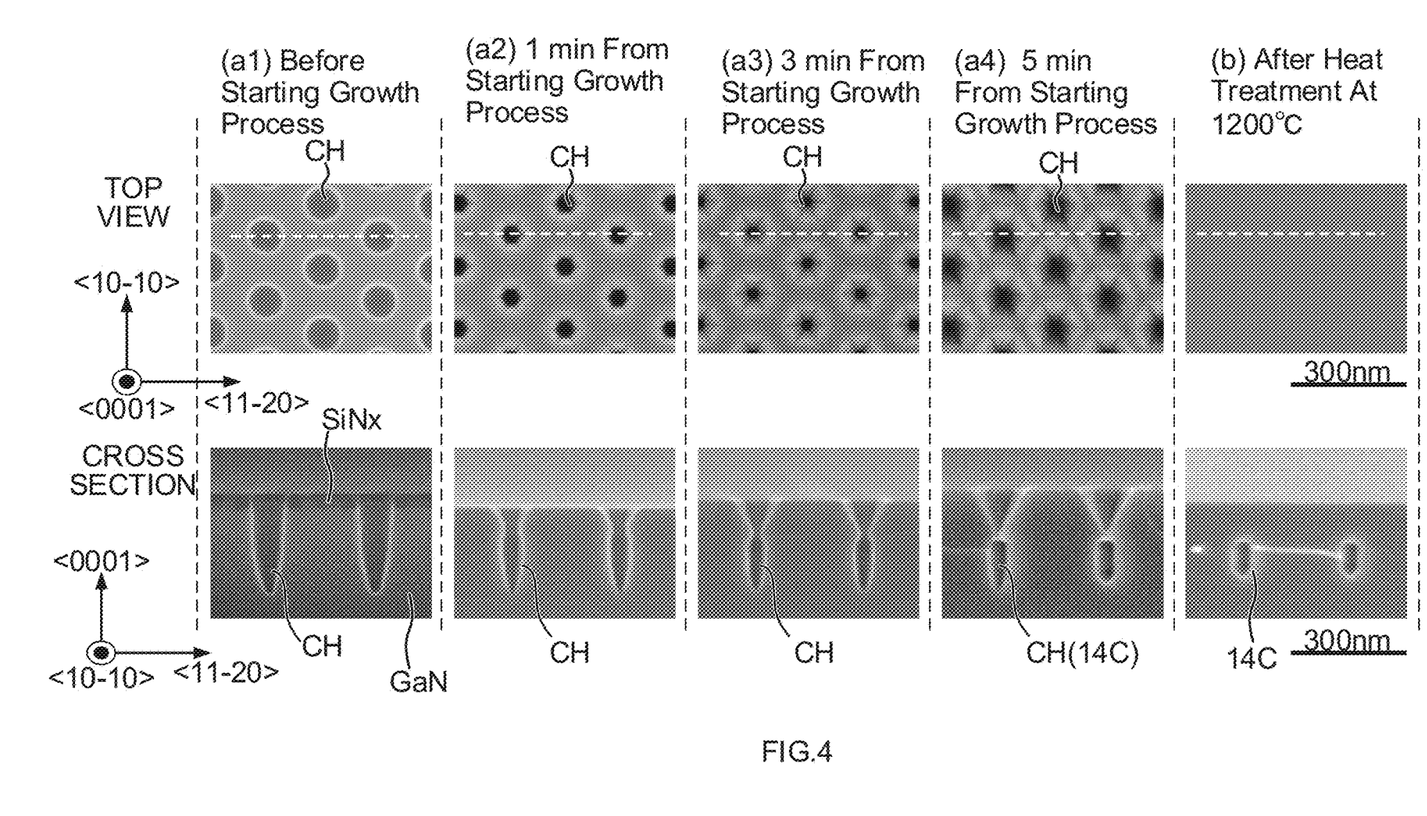
FIG. 4 shows SEM images of the surface and cross section of an optical guide layer in steps after the formation of holes CH.

The substrate after the growth of the n-optical guide layer 14, in other words, the substrate having the optical guide layer (hereinafter referred to as optical guide layer substrate) was taken out of the MOVPE apparatus to form minute holes in the n-optical guide layer 14. Referring to FIGS. 3 and 4, the formation of the holes will be described below in detail. FIG. 3 is a cross-sectional view schematically illustrating a hole CH forming process. FIG. 4 shows SEM (scanning electron microscope) images of the surface and cross section of the optical guide layer substrate in steps after the formation of holes CH. In FIG. 4, the surface SEM images of the optical guide layer substrate are shown in the upper row, and the cross section SEM images, which are taken along broken lines (white) of the surface SEM images, are shown in the lower row.

The optical guide layer substrate in which the n-cladding layer 13 and the n-optical guide layer 14 had been grown on the substrate 12 was cleaned to obtain a clean surface (FIG. 3, (i)). After that, a silicon nitride film (SiNx) SN was laminated (a film thickness of 120 nm) by plasma CVD (FIG. 3, (ii)).

Next, an EB (electron beam) drawing resist RZ was applied to the SiNx film SN with a thickness of the order of 300 nm by spin coating, and a pattern having a two-dimensional periodical structure was formed on a surface of the optical guide layer substrate by an electron beam drawing apparatus (FIG. 3, (iii)). More specifically, patterning was performed, so that circular dots having a diameter (ϕ) of 100 nm were arranged in a plane of the resist RZ in two dimensions into a regular triangular lattice with a period PC of 186 nm.

After the patterned resist RZ was developed, the SiNx film SN was selectively dry etched by an ICP-RIE (inductive coupled plasma-reactive ion etching) apparatus (FIG. 3, (iv)). Therefore, through holes having a diameter (ϕ) of approximately 100 nm that were arranged in two dimensions into a regular triangular lattice with an in-plane period PC of 186 nm were formed in the SiNx film SN.

Subsequently, the resist RZ was removed, and holes CH that extend from a surface of the n-optical guide layer 14 (GaN) to the inside were formed, using the patterned SiNx film SN as a hard mask. More specifically, the holes CH that were arranged in two dimensions in the n-optical guide layer 14 were formed by dry etching using a chlorine-based gas in the ICP-RIE apparatus (FIG. 3, (v)).

FIG. 4 shows a surface SEM image (upper row) and a cross section SEM image (lower row) of the holes CH formed in the n-optical guide layer 14 at this time (FIG. 4 (a1)). As shown in the surface SEM image, a plurality of holes CH that were arranged in two dimensions into a regular triangular lattice (in other words, the vertexes and center of a regular hexagon) with intervals (period) PC between the holes of 186 nm were formed. As shown in the cross section SEM image, the depth of the holes CH formed in the n-optical guide layer 14 was approximately 250 nm, and the diameter of the holes CH was approximately 100 nm. In other words, the hole CH is an opening (hole) whose top surface is open, and is in an approximately cylindrical shape except for its bottom portion.

[Closure of Holes]

The SiNx film SN of the optical guide layer substrate in which the holes CH having two-dimensional periodicity were formed in the n-optical guide layer 14 was removed using a hydrofluoric acid (HF) (FIG. 3 (vi)), and a clear surface was obtained by degreasing. Then, the optical guide layer substrate was introduced again into the MOVPE apparatus.

In the MOVPE apparatus, the optical guide layer substrate was heated to 1100° C. (growth temperature), and was grown so as to have recessed portions having {10-11} facets (facets of a predetermined plane direction) by supply of a group-III material gas (TMG) and a group-V material gas ($NH_3$), to close the openings of the holes CH. Note that, the growth temperature is preferably in a range of 900 to 1150° C.

Figure 5:
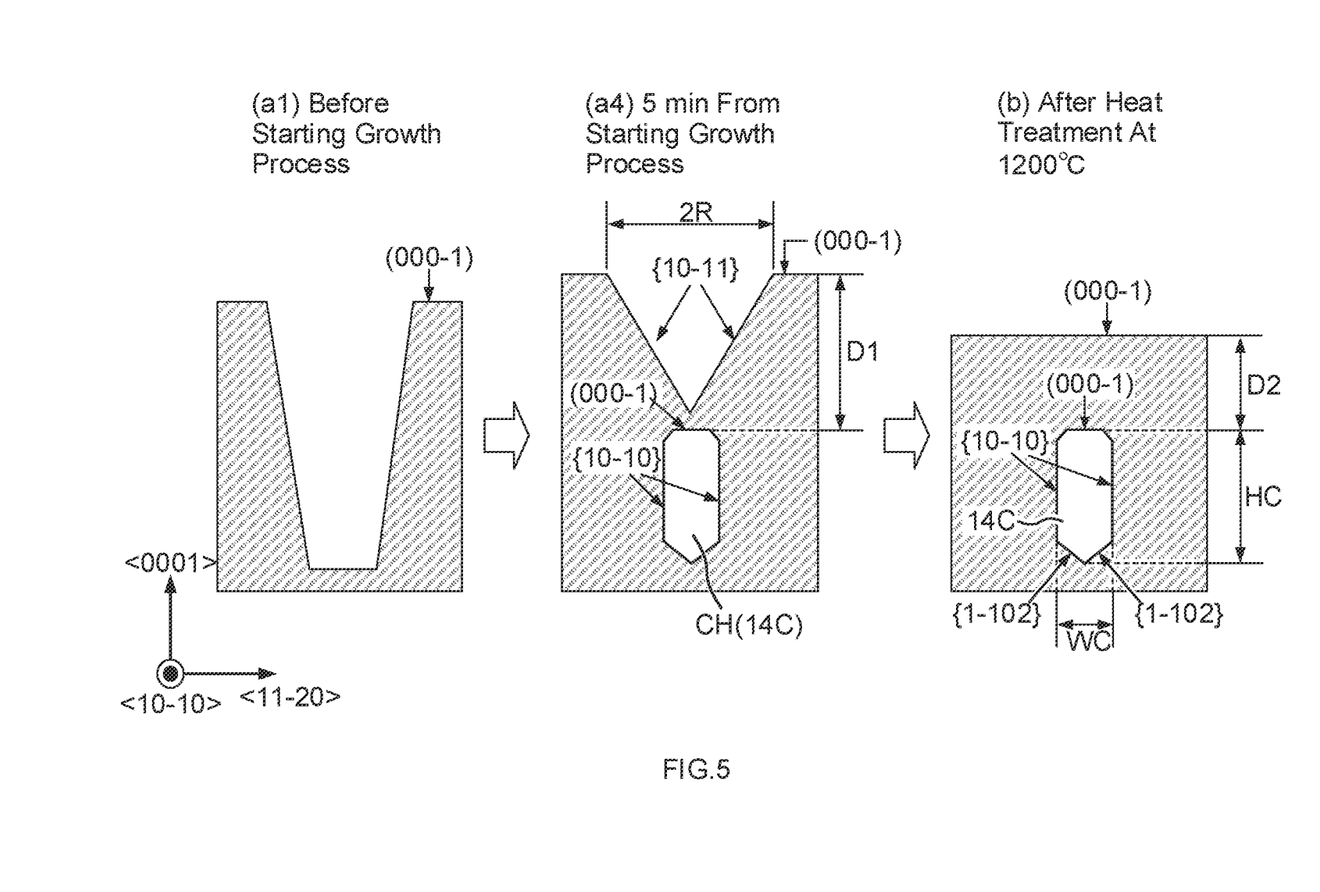
FIG. 5 is a cross-sectional view that schematically explains the cross section of the optical guide layer substrate corresponding to (a1), (a4) and (b) of FIG. 4.

FIGS. 4 ((a2) to (a4) in the drawing) shows variations in the shape of the holes CH at this time with respect to a growth time. FIG. 5 is a cross-sectional view that schematically explains the cross section of the optical guide layer substrate corresponding to (a1), (a4) and (b) of FIG. 4.

As shown in FIG. 4, the {10-11} facets are preferentially grown with a lapse of the growth time (1 minute, 3 minutes and 5 minutes). After 5 minutes from the start of growth, the {10-11} facets that are grown from opposite planes to each other are brought into contact with each other to close the hole CH (FIG. 4, (a4)). A (000-1) plane appears in a surface (top surface) of the embedded hole CH on the side of the active layer 15, and {10-10} planes appears in side surfaces of the hole CH. A {1-102} facet appears in a bottom portion of the hole CH on the side of the substrate 12.

At this time, the distance D1 between the (000-1) plane, which was the top surface of the embedded hole CH, and a (0001) plane, which was an outermost surface of the n-optical guide layer 14, was approximately 140 nm (FIG. 5, (a4)). The opening radius R of the {10-11} facet was approximately 82 nm (FIG. 5, (a4)).

[Planarization of Surface]

After the holes CH were closed by the {10-11} facets, the supply of the group-III material gas was stopped. While the group-V material gas ($NH_3$) was supplied, the temperature was increased to 1200° C. at a temperature increase rate of 100° C./min and maintained. After being maintained (thermal treatment) for 1 minute at 1200° C., the surfaces of the holes were changed as shown in FIG. 4 (FIG. 4(b)). The {10-11} facets formed in the surface of the n-optical guide layer 14 disappeared, and the surface became a flat (0001) plane. The surface was planarized by mass transport, and the surface of the n-optical guide layer 14 was changed into the (0001) plane.

At this time, the distance D2 between a plane (top surface, (000-1) plane) of the embedded hole (cavity) 14C on the side of the active layer 15 and a front surface (i.e., (0001) plane) of the n-optical guide layer 14 was approximately 105 nm (FIG. 5, (b)). The height HC of the hole 14C was approximately 110 nm, and the diameter (width in cross section) WC of the hole CH was approximately 60 nm.

Figure 6:
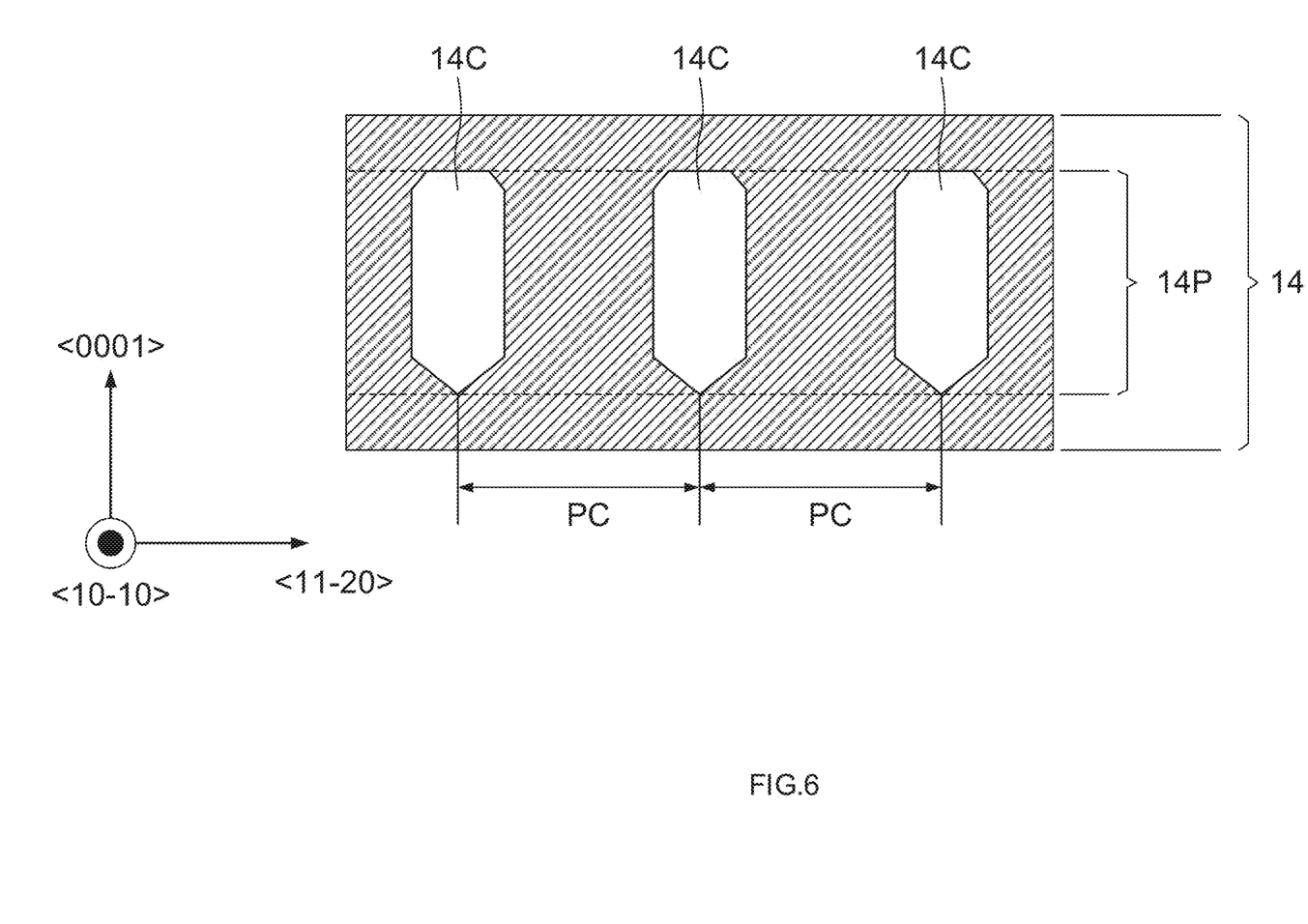
FIG. 6 is a cross-sectional view schematically illustrating a photonic crystal layer 14P and holes 14C arranged in the photonic crystal layer 14P.

FIG. 6 is a cross-sectional view schematically illustrating the photonic crystal layer 14P and the holes 14C arranged in the photonic crystal layer 14P, formed by the above process. As shown in FIG. 6, the photonic crystal layer 14P in which the holes 14C arranged in two dimensions into a regular triangular lattice with a period PC in a plane parallel to the n-optical guide layer 14 were embedded was formed. As shown in FIG. 5, the top surface of the hole 14C is constituted of the (000-1) plane, and the side surfaces thereof are constituted of the {10-10} planes. The bottom portion of the hole 14C on the side of the substrate 12 has the shape of a polygonal pyramid constituted of {1-102} facets. Note that the hole 14C preferably has the shape of a polygonal columnar shape, except for the bottom portion, and at least one of the side surfaces of the hole 14C is preferably the {10-10} plane (facet).

In other words, the photonic crystal layer 14P having the holes 14C arranged in two dimensions with the constant period (PC) was formed in a state of being embedded in the n-optical guide layer 14. Since the respective holes 14C in the photonic crystal layer 14P are arranged to have approximately the same depth (the depth from the top surface was D2) in the n-optical guide layer 14, the top surfaces of the holes 14C formed in the photonic crystal layer 14P forms the top surface of the photonic crystal layer 14P. The holes 14C in the photonic crystal layer 14P have approximately the same height HC. In other words, the photonic crystal layer 14P is formed so as to have a layer thickness HC. The n-optical guide layer 14 has a flat front surface.

Since it is conceivable that the total volume of a GaN layer formed on the holes 14C does not change between before and after the deformation by mass transport, when D and d represent the distance between the top surface (i.e., (000-1) plane) of the hole 14C and the surface (i.e., (0001) plane) of the n-optical guide layer 14 before and after the deformation respectively (here, D=D1, d=D2), r represents an opening radius of the {10-11} facet before the deformation (here, r=R, diameter is 2R), and p represents the period of the holes 14C of the photonic crystal (here, p=PC), the distance d can be estimated from:

[Equation 1]

$$d = D(1-(r/p)^2) \qquad (1)$$

The distance d estimated from the equation (1) was 110 nm, which was almost the same distance as a measured value. Therefore, it was understood that the surface was deformed from the {10-11} facet into the (0001) plane by the diffusion of Ga in the vicinity of the surface.

The holes 14C were thereby embedded in the n-optical guide layer 14 whose surface was the flat (0001) plane, so that the photonic crystal layer 14P could be formed in the n-optical guide layer 14.

At this time, the filling factor (FF), which was the ratio of the different refractive index area (holes 14C) to the base material (GaN) in the photonic crystal layer, was 10.4%. Therefore, the photonic crystal layer having a high diffractive effect to the oscillation wavelength λ could be obtained.

The embodiment describes a case where the temperature of mass transport is 1200° C., but the temperature of mass transport is preferably 1100° C. or higher.

[Growth of Active Layer and p-Type Semiconductor Layer]

Subsequently, multiple quantum well (MQW) layers including five layers of quantum well layers were grown as the active layer 15. A barrier layer and a well layer of the multiple quantum well were made of GaN and InGaN respectively, and had layer thicknesses of 5.0 nm and 3.5 nm respectively. In the present embodiment, the center wavelength of PL emission from the active layer was 405 nm.

The barrier layer was grown with the supply of triethylgallium (TEG) and $NH_3$ after decrease the growth temperature to 850° C. The well layer was grown at the same temperature as that for the barrier layer with the supply of TEG, trimethylindium (TMI), and $NH_3$.

After the growth of the active layer 15, the temperature of the substrate was increased to 1100° C., and the optical guide layer 16 (layer thickness of 100 nm), which was a p-side optical guide layer, was grown. As the optical guide layer 16, an undoped GaN layer was grown without being doped with a dopant.

While the growth temperature was maintained at 1100° C., the electron blocking layer (EBL) 17 and the p-cladding layer 18 were grown on the optical guide layer 16. The electron blocking layer 17 and the p-cladding layer 18 were grown with the supply of TMG, TMA and $NH_3$.

The electron blocking layer 17 was an AlGaN layer (layer thickness of 20 nm) having an Al composition of 18%, and the p-cladding layer 18 was an AlGaN layer (layer thickness of 600 nm) having an Al composition of 6%. While the electron blocking layer 17 and the p-cladding layer 18 were grown, CP2Mg (bis-cyclopentadienyl magnesium) was supplied and a carrier concentration was $4 \times 10^{17}$ cm$^{-3}$.

The laminated structure of the surface emitting laser including the photonic crystal was obtained by the above-described method.

[Investigation 1] Closure of Holes

In the first embodiment described above, the holes CH were closed by growing the {10-11} facets. The (000-1) plane appears in the top surface of the closed hole CH, and the {10-10} planes appear in the side surfaces thereof.

In other words, a lot of N (nitrogen) atoms are present in the vicinity of the surface, and an N-pole surface tends to selectively grow. Therefore, {10-11} that can have N polarity is formed as an oblique facet. It is conceivable that the reason why the {10-11} appears instead of {11-22}, which is also an oblique facet having N polarity, is that dangling bond density is low, that is, surface energy is low. The {10-11} facet grows preferentially with a lapse of the growth time, and closes the holes by being brought into contact with the {10-11} facet that has grown from the opposite side.

When the hole CH was closed, the most stable plane is formed as each surface of the hole CH. The (000-1) plane having the highest N polarity and the lowest dangling bond density is formed as a top surface, and the {1-102} facet having the N polarity is formed as a bottom surface. Since the group-III nitride has no polarity in a direction parallel to the growth direction, the {10-10} plane having the lowest dangling bond density in the same plane appears in the side surface.

[Investigation 2] Planarization of Surface

To planarize the surface, the {10-11} facets present at above the top surfaces of the embedded holes CH are planarized by mass transport, and the surface of the optical guide layer is changed into the (0001) plane.

As described above, after the holes CH were closed by the {10-11} facets, the supply of the group-III atoms is stopped, and the substrate temperature is increased by heating while suppling a nitrogen source.

In other words, when the temperature is increased to a level at which the elimination of N atoms attached to the surface of the n-optical guide layer 14 is increased, the N-polarity plane does not always stable. A stable surface is a plane having low surface energy, in other words, having the lowest dangling bond density. In the group-III nitride, the (0001) plane having the lowest dangling bond density appears. At this time, the supply of the group-III atoms is stopped, the group-III atoms are diffused in the surface plane. Atoms in crests of the {10-11} facets having the most unstable energy are diffused and adhered to troughs of the {10-11} facets having the most stable energy, to form the (0001) plane.

The distance between the (000-1) plane of the embedded hole 14C and the (0001) plane of the outermost surface of the n-optical guide layer 14 thereby becomes short, so the distance between the photonic crystal layer 14P and the active layer 15 is made close. If the group-III nitride constituting the n-optical guide layer 14 does not sublimate, the total volume does not change between before and after the deformation, and the distance between the (000-1) plane of the embedded hole 14C and the (0001) plane of the outermost surface of the n-optical guide layer 14 becomes close by a volume for embedding the recessed portions formed of the {10-11} facets of the outermost surface of the n-optical guide layer 14. Therefore, the holes 14C having the two-dimensional period were embedded in the n-optical guide layer 14 whose top surface was the flat (0001) plane without increasing a distance between the photonic crystal layer 14P and the active layer 15.

[Investigation 3] Comparison with Comparative Examples

As a first comparative example, holes CH were embedded only by the same process as the planarizing process (mass transport) of the first embodiment. More specifically, the supply of the group-III material was stopped, and the holes CH were embedded by only the process in which temperature was increased by heating while suppling the nitrogen source.

Figure 7:
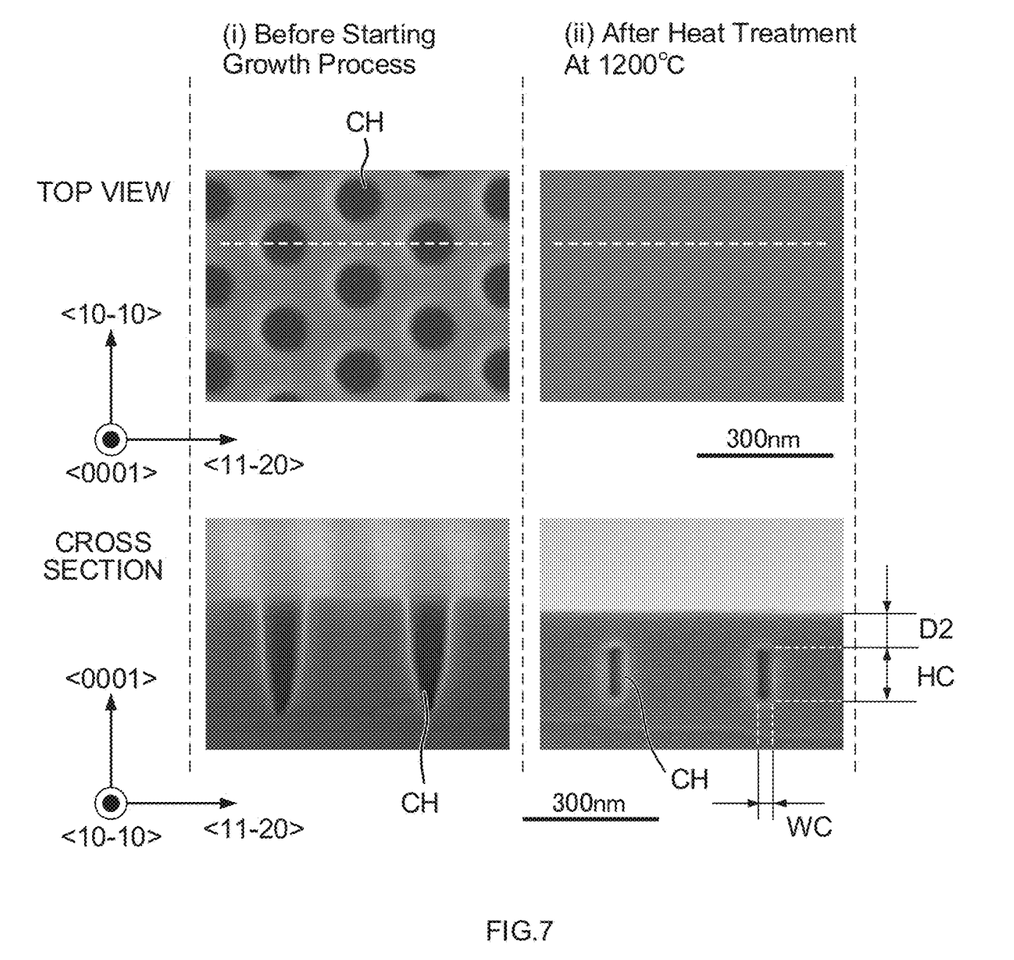
FIG. 7 shows SEM images of the surface (upper row) and cross section (lower row) of holes CH before growth and after thermal treatment, according to a first comparative example.

The process will be described below with reference to FIG. 7. In the same process as that of the first embodiment, holes CH were formed in two dimensions into a regular triangular lattice with a period PC of 186 nm using an SiNx as a hard mask. After that, the SiNx was removed by HF, and degreasing was performed to obtain a optical guide layer substrate having a clean surface. FIG. 7 (i) shows a surface SEM image (upper row) and a cross section SEM image (lower row) of the holes CH at this time.

The optical guide layer substrate was put in the MOVPE apparatus, and temperature was increased to 1200° C. at a temperature increase rate of 100° C./min, while $NH_3$ was supplied, and maintained in that state. After the temperature was maintained at 1200° C. for 1 minute, the surfaces of the holes CH were changed as shown in FIG. 7 (ii), so that the surface of the optical guide layer became a flat (0001) plane.

At this time, the distance D2 between a (000-1) plane, which was a plane of the embedded hole CH on the side of the active layer, and a (0001) plane, which was the outermost surface of the optical guide layer, was 83 nm. The height HC of the hole CH was 113 nm, and the diameter (width in cross section) WC of the hole CH became 38 nm, very narrow. At this time, the FF of the hole was 4.2%, and a radiation constant became almost 0, and so light could not be extracted in an emission direction.

As a second comparative example, holes CH were embedded only by the same process as the hole closing process according to the first embodiment. The process will be described below with reference to FIG. 8.

Figure 8:
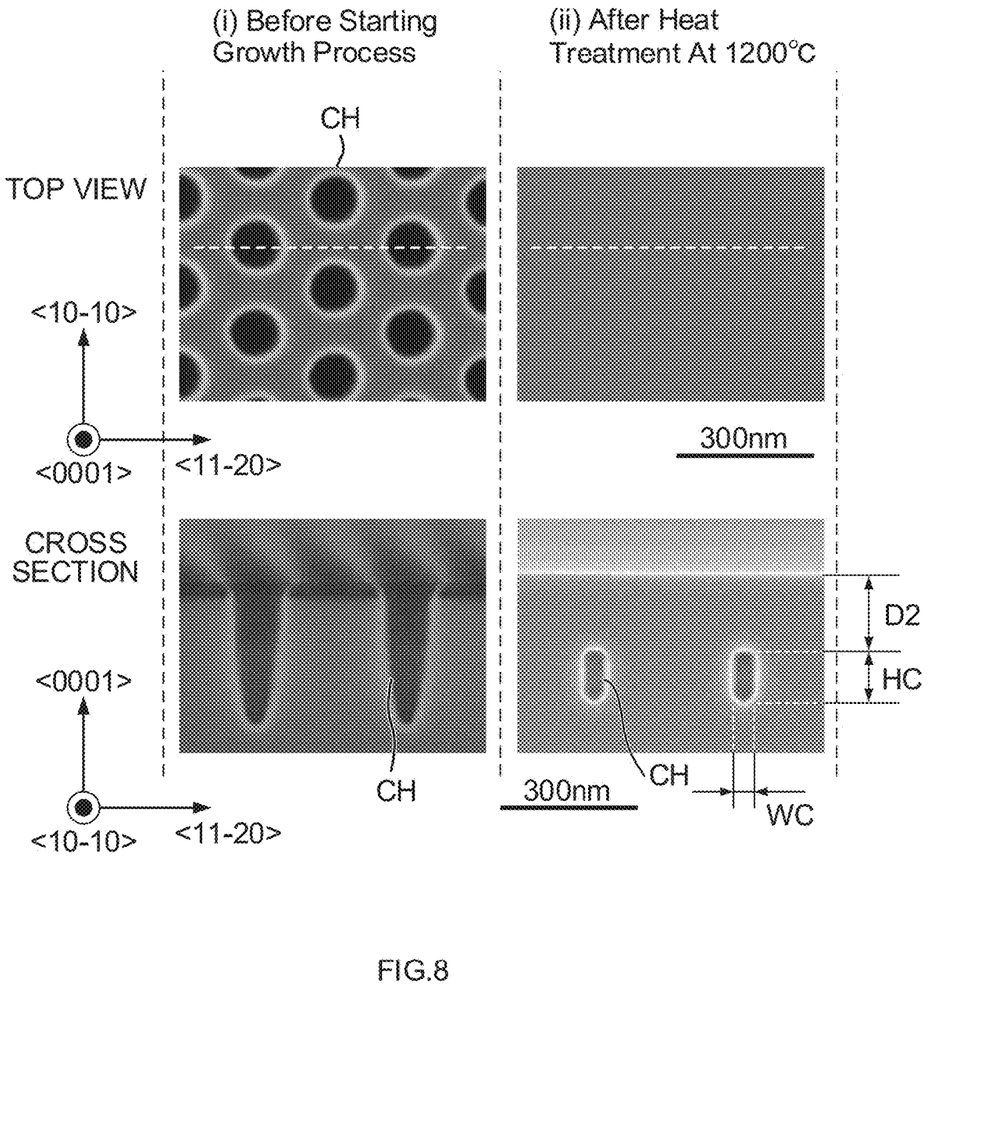
FIG. 8 shows SEM images of the surface (upper row) and cross section (lower row) of holes CH before growth and after thermal treatment, according to a second comparative example.

In the same process as that of the first embodiment, holes CH were formed in two dimensions into a regular triangular lattice with a period of 186 nm. FIG. 8 (i) shows a surface SEM image (upper row) and a cross section SEM image (lower row) of the holes CH at this time.

The optical guide layer substrate was put in the MOVPE apparatus, and temperature was increased to 1100° C. at a temperature increase rate of 100° C./min, while TMG and $NH_3$ were supplied, to close the holes CH. FIG. 8 (ii) shows a surface image and a cross section image, when the growth time is 10 minutes.

About FF, the holes CH having almost the same size as the first embodiment could be embedded. However, the distance D2 between a (000-1) plane, which was a plane of the embedded hole CH on the side of the active layer, and a (0001) plane, which was the outermost surface of the optical guide layer, was 164 nm. Note that the dimeter WC of the hole CH was 61 nm, and the height HC thereof was 113 nm.

When the growth time was 8 minutes, an oblique facet was left in the surface of the optical guide layer, and a flat (0001) plane could not be obtained. Therefore, when the holes are embedded only by the process of supplying a group-III material and $NH_3$, the distance between the (000-1) plane of the hole and the (0001) plane, which is the surface of the optical guide layer, becomes long, thus $\Gamma_{PV}$ can not be increased.

According to the results of the first and second comparative examples, it was difficult to have a sufficiently high FF of the holes of the photonic crystal portion, while the distance between the (000-1) plane of the top plane of the embedded hole and the (0001) plane of the top surface of the optical guide layer on the side of the active layer is shortened.

Second Embodiment

Figure 9:
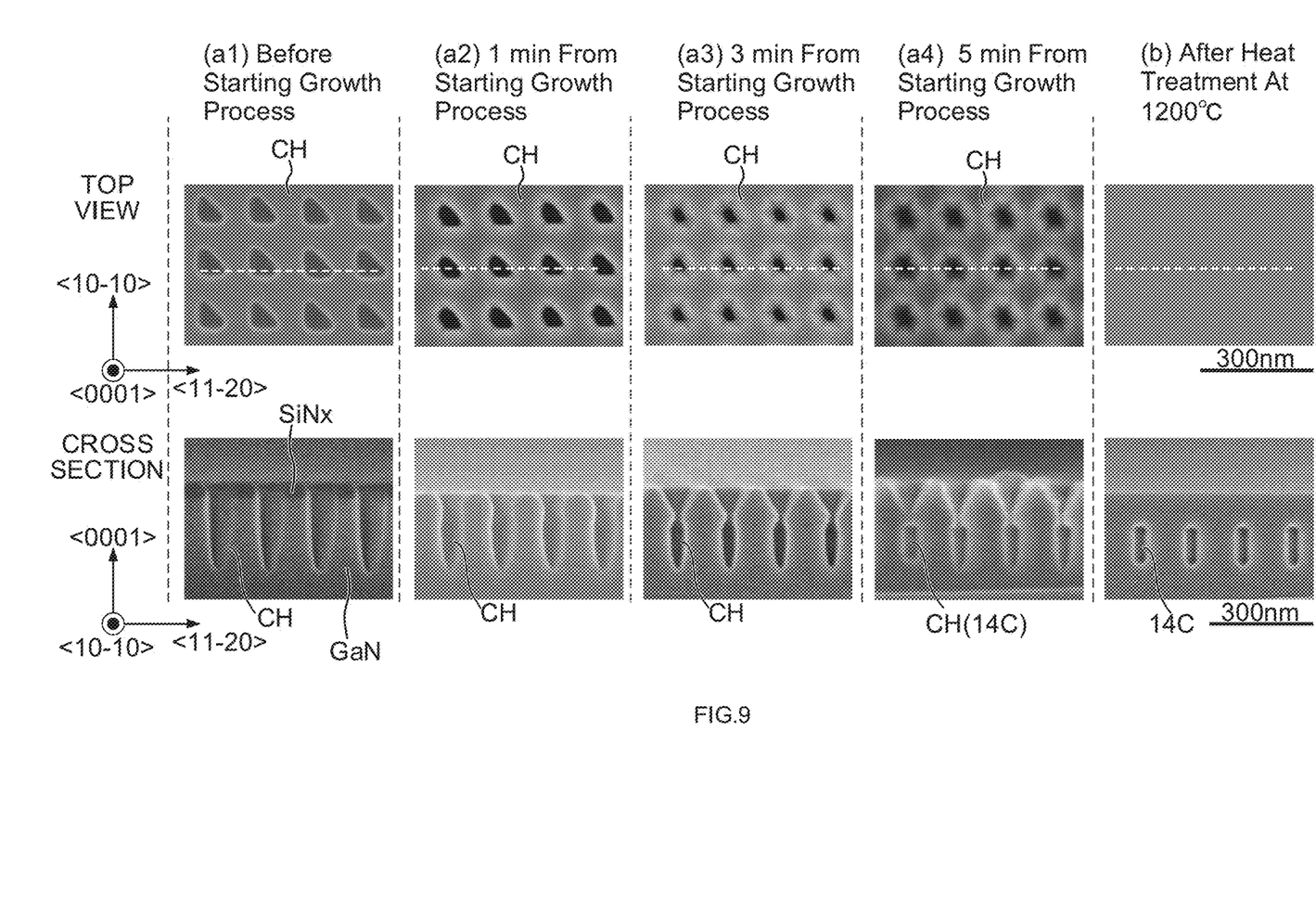
FIG. 9 shows images of a photonic crystal layer 14P forming process in a photonic crystal surface emitting laser according to a second embodiment.

FIG. 9 is a drawing showing the formation of a photonic crystal layer 14P in a photonic crystal surface emitting laser 10 according to a second embodiment. More specifically, FIG. 9 shows surface SEM images (upper row) and cross section SEM images (lower row) of holes CH formed in a n-optical guide layer 14. Note that the structure of a photonic crystal surface emitting laser 10 is the same as that of the first embodiment (FIG. 2).

As shown in FIG. 9, an SiNx film SN was formed on a surface of the optical guide layer substrate in the same process as that of the first embodiment. Next, the SiNx film SN was selectively dry etched by an ICP-RIE apparatus, to form through holes that were arranged in two dimensions into a square lattice with an in-plane period PC of 161 nm on the SiNx film SN. In other words, the through holes in the shape of an right-angled isosceles triangle having a short side length of 100 nm were formed so as to penetrate the SiNx film SN.

Subsequently, holes CH were formed from a surface of the n-optical guide layer 14 (GaN) using the patterned SiNx film SN as a hard mask. More specifically, the holes CH that had a depth of approximately 230 nm and a shape of an right-angled isosceles right triangle having a short side length of 100 nm were formed in the n-optical guide layer 14 so as to be arranged in a plane in two dimensions into a square lattice with a period PC of 161 nm (FIG. 9, (a1)).

Next, as in the case of the first embodiment, in the MOVPE apparatus, the optical guide layer substrate was heated to 1100° C., and a group-III material gas (TMG) and a group-V material gas (NH$_3$) were supplied to form {10-11} facets and close openings of the holes CH. FIGS. 9 ((a2) to (a4) in the drawing) shows variations in the shape of the holes CH at this time, with respect to a growth time.

As shown in FIG. 9, as in the case of the first embodiment, the {10-11} facets are grown preferentially with a lapse of the growth time (1 minute, 3 minutes and 5 minutes), and the {10-11} facet that is grown from opposite sides to each other are brought into contact with each other in 5 minutes after the start of growth so as to close the hole CH (FIG. 9, (a4)). At this time, the distance D1 between a (000-1) plane, which was a top surface of the embedded hole 14C, and a (0001) plane, which was a surface of the n-optical guide layer 14, was approximately 140 nm (FIG. 9, (a4)).

Note that, in this case, the shape of a gap formed in a growth face by the {10-11} facets in the surface of the n-optical guide layer 14 is a regular hexagon in the first embodiment, but is an irregular hexagon whose sides have various lengths in the second embodiment (FIG. 9, upper images of (a3) and (a4)). Since the cross sectional shape of the embedded hole has a similar figure thereof, it is possible to form a photonic crystal layer 14P in which the holes 14C of an irregular shape are embedded by adjusting the initial shape of patterning.

After the holes CH were closed by the {10-11} facets, as in the case of the first embodiment, the supply of the group-III material gas was stopped. While the group-V material gas (NH$_3$) was supplied, the temperature was increased to 1200° C. at a temperature increase rate of 100° C./min and maintained. After being maintained (thermal treatment) for 1 minute at 1200° C., the surfaces of the holes were changed as shown in FIG. 9 (FIG. 9(b)). The {10-11} facets formed in the surface of the n-optical guide layer 14 disappeared, and the surface became a flat (0001) plane. The surface was planarized by mass transport, and the surface of the n-optical guide layer 14 was changed into the (0001) plane.

At this time, the distance D2 between a plane (i.e., (000-1) plane) of the formed hole 14C on the side of an active layer 15 and the surface of the n-optical guide layer 14 (i.e., (0001) plane) was approximately 94 nm (FIG. 9, (b)). The height HC of the hole 14C was approximately 136 nm, and the width WC of the hole CH in cross section was approximately 58 nm.

Figure 10:
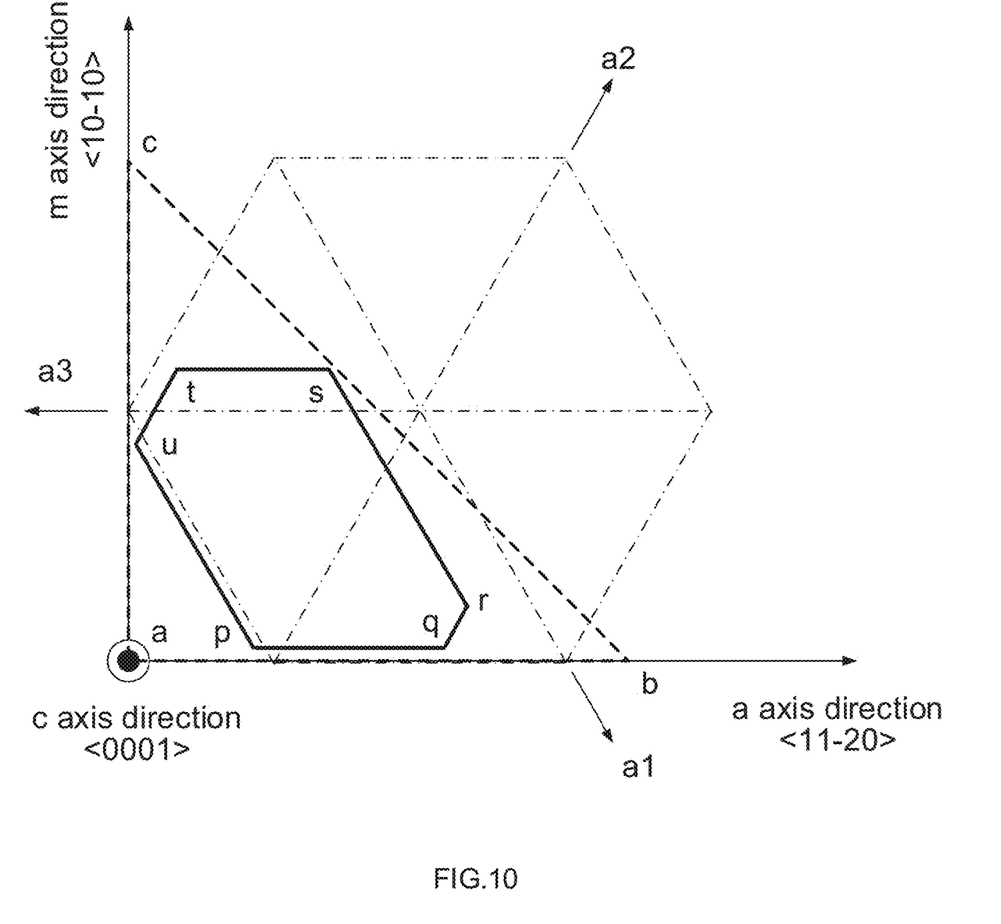
FIG. 10 is a graph that schematically explains change in the shape of a hole 14C in a growth plane according to the second embodiment.

Note that, as described above, in the second embodiment, the shape of the hole 14C in the growth face is an irregular hexagon whose sides have various lengths. FIG. 10 is a graph that schematically explains variations in the shape of the hole 14C in the growth plane.

More specifically, the shape of the hole CH formed in the n-optical guide layer 14 is an isosceles right triangle abc. The shape of the hole CH changes by planarizing growth and mass transport. After the planarizing growth and mass transport, the hole 14C has {10-10} planes (m planes) as side surfaces, and has a shape of an irregular hexagon pqrstu in the growth plane. In other words, the hole 14C has the shape of a polygonal column having the {10-10} planes as the side surfaces, and an asymmetrical shape with respect to diagonal lines (for example, diagonal lines ps, qt and the like) in a plane parallel to the n-optical guide layer 14.

Note that, in the above embodiments, the various values and the like are just examples. The values can be appropriately changed without departing from the scope of the present invention.

The above-described embodiments describe cases in which the semiconductor structure layer 11 has the electron blocking layer 17, but may not have the electron blocking layer 17. Alternatively, the semiconductor structure layer 11 may have a contact layer, a current diffusion layer or another semiconductor layer.

The present specification describes, as an example, a case in which the first conductive type semiconductor (n-type semiconductor), the active layer and the second conductive type semiconductor (p-type semiconductor, which is the opposite conductive type to the first conductive type) are grown in this order, but the first conductive type may be a p-type and the second conductive type may be an n-type.

As described above, according to the present invention, it is possible to provide the surface emitting laser including the photonic crystal that has a uniform refractive index period and a high diffraction effect, and the manufacturing method thereof. It is also possible to provide the surface emitting laser including the photonic crystal that has a high filling factor and a high optical confinement factor, and the manufacturing method thereof.

REFERENCE SIGNS LIST 10 photonic crystal surface emitting laser
12 substrate
13 n-cladding layer
14 n-optical guide layer
14P photonic crystal layer
14C hole
15 active layer
16 optical guide layer
18 p-cladding layer

The invention claimed is:

1. A method for manufacturing a surface emitting laser made of a group-III nitride semiconductor by an MOVPE method, comprising:
   (a) a step of growing a first cladding layer of a first conductive type on a substrate;
   (b) a step of growing a first optical guide layer of said first conductive type on said first cladding layer;
   (c) a step of forming holes having a two-dimensional periodicity in a plane parallel to said first optical guide layer, in said first optical guide layer by etching;
   (d) a step of supplying a gas containing a group-III material and a nitrogen source and performing growth to close openings of said holes thereby forming (i) cavities within said first optical guide layer and (ii) recessed portions on an upper surface of said first optical guide layer, wherein said recessed portions are formed above said cavities and have facets of a predetermined plane direction; and
   (e) a step of planarizing the upper surface of said first optical guide layer by mass transport, after said step (d).

2. The manufacturing method according to claim 1, further comprising:
   (f) a step of growing an active layer on said first optical guide layer after said step (e), wherein a growth plane of said first optical guide layer is a (0001) plane, and a plane of said cavities on a side of said active layer, after said step (e), is a (000-1) plane.

3. The manufacturing method according to claim 1, wherein a plane of said cavities on a side of said first cladding layer, after said step (e), includes a {1-102} facet.

4. The manufacturing method according to claim 1, wherein in said step (d), the facet of said predetermined plane direction includes a {10-11} facet.

5. The manufacturing method according to claim 1, wherein a growth temperature in said step (d) is 900° C. or higher and 1100° C. or lower.

6. The manufacturing method according to claim 1, wherein a temperature of said mass transport in said step (e) is 1100° C. or higher.

7. A surface emitting laser made of a group-III nitride semiconductor comprising:
 a first cladding layer of a first conductive type formed on a substrate;
 a first optical guide layer of said first conductive type formed on said first cladding layer, the first optical guide layer having cavities therein which are arranged to have a two-dimensional periodicity in a plane parallel to said first optical guide layer, wherein a photonic crystal layer is formed inside said first optical guide layer;
 an active layer formed on said first optical guide layer;
 a second optical guide layer of a second conductive type formed on said active layer, the second conductive type being an opposite conductive type to said first conductive type; and
 a second cladding layer of said second conductive type formed on said second optical guide layer,
 wherein a surface of said first optical guide layer in contact with the active layer is a (0001) plane, and a plane of said cavities on a side of said active layer is a (000-1) plane; and
 wherein a filling factor of said photonic crystal layer is 5% or more.

8. The surface emitting laser according to claim 7, wherein said cavities have a polygonal columnar shape, and at least one of side planes of said cavities is a {10-10} facet.

9. The surface emitting laser according to claim 7, wherein said cavities have a polygonal columnar shape, and have an asymmetrical cross section with respect to a diagonal line in a cross section parallel to said first optical guide layer.

10. A surface emitting laser made of a group-III nitride semiconductor comprising:
 a first cladding layer of a first conductive type formed on a substrate;
 a first optical guide layer of said first conductive type formed on said first cladding layer, the first optical guide layer having cavities therein which are arranged to have a two-dimensional periodicity in a plane parallel to said first optical guide layer;
 an active layer formed on said first optical guide layer;
 a second optical guide layer of a second conductive type formed on said active layer, the second conductive type being an opposite conductive type to said first conductive type; and
 a second cladding layer of said second conductive type formed on said second optical guide layer,
 wherein at least one of side surfaces of said cavities is a {10-10} facet, and
 wherein said first optical guide layer includes a first portion which have recesses respectively formed above each of said cavities, wherein each of said recesses have at least one facet of a predetermined plane direction, and
 wherein said first optical guide layer further includes a second portion which planarizes an upper surface of said first optical guide layer by filling said recesses.

11. The surface emitting laser according to claim 10, wherein at least one of facets of said recesses is a {10-11} facet.

* * * * *